(12) United States Patent
Katsumura et al.

(10) Patent No.: US 7,098,160 B2
(45) Date of Patent: Aug. 29, 2006

(54) DIELECTRIC CERAMIC COMPOSITION AND CERAMIC ELECTRONIC COMPONENT EMPLOYING THE SAME

(75) Inventors: Hidenori Katsumura, Kobe (JP); Ryuichi Saito, Hirakata (JP); Hiroshi Kagata, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 47 days.

(21) Appl. No.: 10/912,236

(22) Filed: Aug. 6, 2004

(65) Prior Publication Data
US 2005/0030701 A1  Feb. 10, 2005

(30) Foreign Application Priority Data
Aug. 7, 2003 (JP) .............. 2003-288763

(51) Int. Cl.
*C04B 35/495* (2006.01)
(52) U.S. Cl. .................. 501/135; 428/209; 428/701; 264/618
(58) Field of Classification Search ........... 501/135; 428/209, 701; 264/618
See application file for complete search history.

(56) References Cited

U.S. PATENT DOCUMENTS

| | | | |
|---|---|---|---|
| 5,273,944 A | 12/1993 | Kagata et al. | 501/135 |
| 5,629,252 A * | 5/1997 | Nishimoto et al. | 501/136 |

FOREIGN PATENT DOCUMENTS

| | | | |
|---|---|---|---|
| JP | 7-57540 | * | 3/1995 |
| JP | 7-312511 | * | 11/1995 |
| JP | 2798105 | | 7/1998 |
| JP | 2000-306762 | * | 11/2000 |

* cited by examiner

*Primary Examiner*—Karl Group
(74) *Attorney, Agent, or Firm*—Steptoe & Johnson LLP

(57) ABSTRACT

A dielectric ceramics includes a main ingredient, and a supplemental ingredient in an amount of 0.05 to 2 wt % for the main ingredient. The main ingredient is expressed by $xBiO_{3/2}$-$yCaO$-$zNbO_{5/2}$ and is within a scope of a specified quadrilateral region in a ternary system diagram, and the supplemental ingredient is a glass composition including at least $SiO_2$, $Li_2O$ and MO (M includes at least one of Ca, Sr and Ba). A ceramic electronic component is produced by co-firing a dielectric layer composed of the dielectric ceramics and a conductive layer mainly composed of silver, and has a low degradation in Q value and excellent microwave characteristics.

5 Claims, 3 Drawing Sheets

($BiO_{3/2}$, $CaO$, $NbO_{5/2}$) = (0.70, 0.10, 0.20)

($BiO_{3/2}$, $CaO$, $NbO_{5/2}$) = (0.40, 0.10, 0.50)

($BiO_{3/2}$, $CaO$, $NbO_{5/2}$) = (0.40, 0.40, 0.20)

ic Ceramic Composition and Ceramic Electronic Component Employing the Same

TECHNICAL FIELD

The invention relates to a dielectric ceramic composition useful for high frequency devices including a resonator, a filter, an antenna, a capacitor, an inductor, and a circuit board used in a high frequency band particularly in a microwave and a millimeter wave zones, and the ceramic electronic components employing the dielectric ceramic composition.

BACKGROUND OF ART

In response to recent development of mobile communication devices, a variety of dielectric ceramic electronic components having a multilayer construction and a circuit formed by stacking a dielectric ceramics and an inner conductor is commonly used. In order to obtain a multilayer dielectric ceramic electronic component particularly having compact size and high performance, dielectric characteristics of the ceramics become important factors. That is to say, a high specific-inductive-capacity ($\in r$) in microwave zone is required, and a low dielectric loss (tan δ) is required. Namely, a high Q value, which is reciprocal number of the dielectric loss, is required. A low temperature coefficient of resonance frequency (TCF) is also required in its absolute value.

As an internal conductor, metal of high conductivity containing such as gold, silver and copper as a main ingredient is employed. The conductor is co-fired with the dielectric ceramics, forming a unit. For that reason, the dielectric ceramics is required to be sintered densely at a relatively low temperature like 850 to 1,050° C. so as the metal mentioned above do not melt by the firing. As the metal, silver is especially employed because melting point is 962° C. the lowest among gold, silver and copper, conductivity is high and is not oxidized when sintered in air, making management of sintering process is easy. Moreover, the cost of silver is comparatively low, such that silver is industrially advantageous.

As an example of the dielectric ceramic composition satisfying above requirements, material of $BiO_{3/2}$-CaO-$NbO_{5/2}$ family is proposed. The family material has a high specific inductive capacity of at least 50, a high Q value of 3 to 5 GHz, and a small TCF of less than ±50 ppm/° C. Because the material is sintered densely at a low temperature of at most 1,050° C., a multilayer dielectric ceramic component composed of a high conductivity metal such as gold, silver and copper can be provided, so that it is a highly useful dielectric material. This kind of dielectric material is disclosed in Japanese Patent Publication No. 2798105, for instance.

However, while firing to making the dielectric ceramic electronic component made by laminating a conductive layer composed of silver as a main ingredient with an inside layer mainly composed of the dielectric ceramic material of $BiO_{3/2}$—CaO—$NbO_{5/2}$ family material, silver in the conductive layer reacts chemically with a constituent element in the dielectric ceramics. As a result, Q value of the dielectric ceramics is dropped, prohibiting the dielectric ceramic electronic component to present its original microwave characteristics.

SUMMARY OF THE INVENTION

The dielectric ceramic composition of the present invention includes bismuth oxide, calcium oxide and niobium oxide as a main ingredient. When the main ingredient is expressed by a formula $xBiO_{3/2}$-$yCaO$-$zNbO_{5/2}$ (x, y and z are in molar ratio, and x+y+z=1.0), x, y and z fall in a region enclosed by a quadrilateral having vertices A, B, C and D listed below in a ternary system diagram. The dielectric ceramic composition also includes, as a supplemental ingredient, 0.05 to 2% in weight (wt %) of a glass composition containing at least $SiO_2$, $Li_2O$ and MO, wherein M stands for at least one of metal ions of Ca, Sr and Ba. With this composition, reaction between a constituent element in the dielectric ceramic composition and silver during firing process is prevented. Thus, even when the ceramic composition is co-fired with a conductive layer having silver as a main ingredient, degradation of Q value is small, so that a dielectric ceramic composition having excellent microwave characteristics is provided.

A: (x, y, z)=(0.48, 0.184, 0.336), B: (x, y, z)=(0.48, 0.22. 0.30) C: (x, y, z)=(0.44, 0.24, 0.32), D: (x, y, z)=(0.44, 0.20, 0.36)

DETAILED DESCRIPTION OF PREFERRED EMBODIMENT

Figure 1:
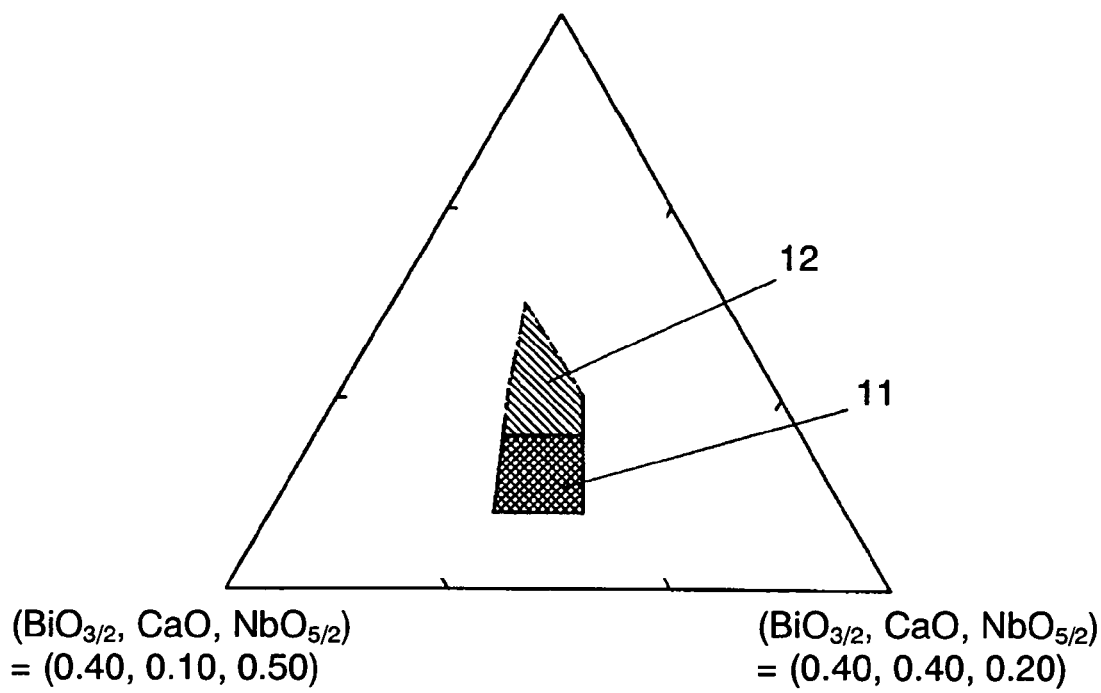
FIG. 1 is a diagram showing a region of composition of $BiO_{3/2}$—CaO—$NbO_{5/2}$ in accordance with an exemplary embodiment of the present invention.
Figure 2:
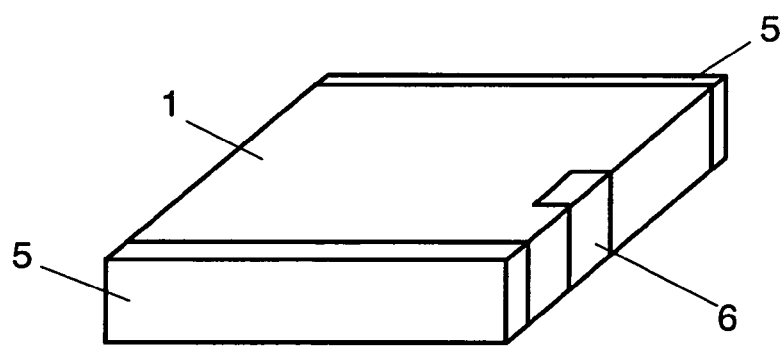
FIG. 2 is a perspective view of a multilayer resonator having a strip line conductive layer in accordance with the exemplary embodiment of the present invention.
Figure 3:
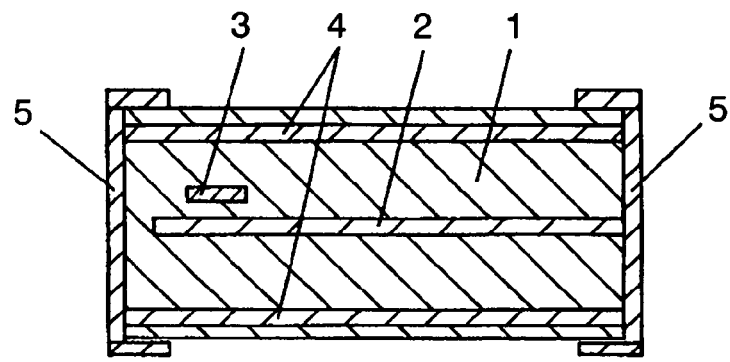
FIG. 3 is a longitudinal sectional view of the multilayer resonator illustrated in FIG. 2.
Figure 4:
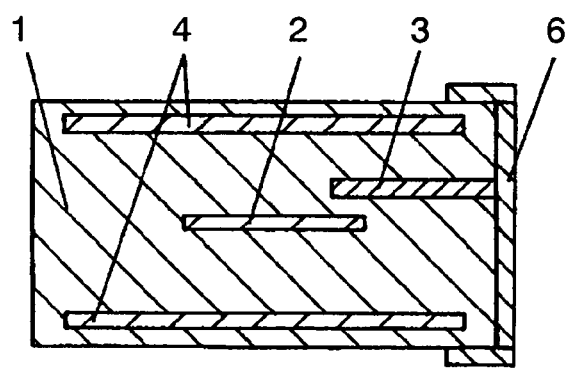
FIG. 4 is a transverse sectional view of the multilayer resonator illustrated in FIG. 2.
Figure 5A:
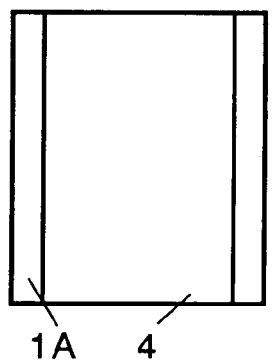
FIGS. 5A to 5C are drawings each showing a pattern of electrode of each inner layer of the multilayer resonator shown in FIG. 2.
Figure 5B:
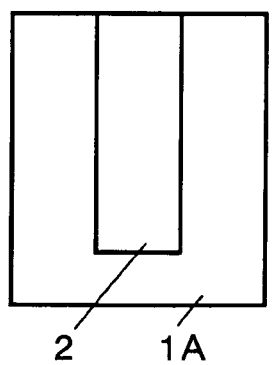
Figure 5C:
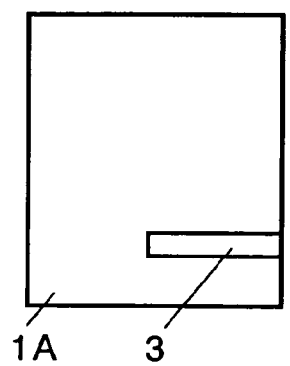

FIG. 1 is a diagram showing a region of composition of $xBiO_{3/2}$-$yCaO$-$zNbO_{5/2}$, a main ingredient of a dielectric ceramic composition, according to an exemplary embodiment of the present invention. FIG. 2 is a perspective view of a multilayer resonator that is a ceramic electronic component according to the exemplary embodiment of the present invention. FIG. 3 is a longitudinal sectional view, and FIG. 4 is a transverse sectional view of the resonator. FIGS. 5A to 5C are drawings each showing an electrode pattern of each inner layer.

Initially, the dielectric ceramic composition is described in detail. Table 1 shows molar ratio sets of some examples of $BiO_{3/2}$—CaO—$NbO_{5/2}$, a main ingredient of the ceramic composition, according to the present embodiment, wherein x, y, and z represent a molar ratio, and x+y+z=1.0. As a starting material for producing the dielectric ceramic composition in accordance with the present embodiment, material such as an oxide, a carbonate, a nitrate, and an organometal compound of the constituent element are used. Material having a 99% or more of purity is desirable, but the purity is not limited. Samples number 1 to 3 fall within the region of composition shown in FIG. 1, and samples 4 to 7 are on boundary lines.

Readily available oxide materials are prepared as starting materials. They are weighed so as they are combined in the molar ratio shown in Table 1. Subsequently, they are mixed with water as a solvent for 24 hours by ball milling method to be made for slurry. Then the slurry is dried and put into a crucible made of alumina so as to be calcined at 800° C. for 2 hours and be made for calcined powder. The calcined powder is ground and then a prescribed amount of glass composite powder, that is a supplemental ingredient which is to be described later, is added. They are mixed, ground and dried by similar methods as described above. Thus, the dielectric ceramic composition powder is obtained.

TABLE 1

| No. | x<br>$BiO_{3/2}$ | y<br>CaO | z<br>$NbO_{5/2}$ |
|---|---|---|---|
| 1 | 0.46 | 0.215 | 0.325 |
| 2 | 0.45 | 0.215 | 0.335 |
| 3 | 0.47 | 0.2 | 0.33 |
| 4 | 0.48 | 0.184 | 0.336 |
| 5 | 0.48 | 0.22 | 0.3 |
| 6 | 0.44 | 0.24 | 0.32 |
| 7 | 0.44 | 0.2 | 0.36 |
| 8 | 0.49 | 0.2 | 0.31 |
| 9 | 0.43 | 0.22 | 0.35 |
| 10 | 0.46 | 0.235 | 0.305 |
| 11 | 0.46 | 0.185 | 0.355 |

(unit: molar ratio)

Next, production method of the glass composition that is the supplemental ingredient is described.

TABLE 2

| kind | u<br>$SiO_2$ | v<br>$Li_2O$ | w | | | MO<br>total |
|---|---|---|---|---|---|---|
| | | | CaO | BaO | SrO | |
| A | 60 | 10 | 10 | 20 | 0 | 30 |
| B | 60 | 10 | 10 | 10 | 10 | 30 |
| C | 60 | 10 | 0 | 20 | 10 | 30 |
| D | 60 | 10 | 30 | 0 | 0 | 30 |
| E | 70 | 5 | 10 | 15 | 0 | 25 |
| F | 70 | 15 | 10 | 5 | 0 | 15 |
| G | 50 | 5 | 20 | 20 | 5 | 45 |
| H | 50 | 15 | 10 | 20 | 5 | 35 |
| I | 60 | 5 | 10 | 20 | 5 | 35 |
| J | 60 | 15 | 10 | 15 | 0 | 25 |
| K | 45 | 10 | 20 | 20 | 5 | 45 |
| L | 75 | 10 | 5 | 10 | 0 | 15 |
| M | 60 | 3 | 12 | 20 | 5 | 37 |
| N | 60 | 18 | 10 | 12 | 0 | 22 |

(unit: wt %)

Table 2 shows weight percentage of constituent elements of the glass composition, the supplemental ingredient, to be used according to the exemplary embodiment of the present invention. The composition of the glass composition is expressed by a formula $uSiO_2$-$vLi_2O$-$wMO$, wherein u, v and w represent weight % (hereinafter, shown by wt %) of respective element, u+v+w=100, and M stands for one or more of metal ions of Ca, Sr and Ba. First, commercially available oxide materials are weighed so as each constituent element satisfies the weight percentage in Table 2. Then, the stating materials are mixed together with a solvent of ethyl alcohol for 24 hours by ball milling method to be made for slurry. After the slurry is dried, it is put into a platinum crucible so as to be melted by heating at 1,200 to 1,400° C. for one hour. The melted material is dropped on a metal sheet to be cooled down rapidly, and then a lump of glass is made. The obtained lump of glass is ground by the ball milling method or the like into a prescribed size of powder. Thus, the glass composition powder of the supplemental ingredient is obtained. An effect of the glass composition is explained later.

Following, an evaluation method of a sintered body of the dielectric ceramic composition in accordance with the exemplary embodiment is explained referring to the main ingredient of $xBiO_{3/2}$-$yCaO$-$zNbO_{5/2}$ composition and the supplemental ingredient of the glass composition. First, dielectric ceramic composition powder is prepared by mixing the main ingredient and the supplemental ingredient shown in Table 1 and Table 2 so as to achieve the composition shown in Table 3. Subsequently, 10 wt % of aqueous solution of polyvinyl alcohol having a concentration of 5% is mixed as a binder and then, is passed through a sieve having a 32-mesh so as to be granulated. Then, the granulated powder is pressed to make into a cylinder of 13 mm in diameter and about 8 mm in thickness at 100 MPa and into a disk of 13 mm in diameter and about 1 mm in thickness. The pressed bodies are heated at 600° C. for 2 hours such that the binder is burnt out. Then, after the body has been put into a vessel made of magnesia, a lid is placed on the vessel. The vessel is held in air at 850 to 1,100° C. for 2 hours so as to fire the body.

Table 3 exhibits characteristics of dielectric ceramic compositions in different mix of compounds measured about the sintered body which is fired at a temperature giving a maximum density. A commercially available silver paste is applied to front and back sides of the produced disk and is fired at 850° C. for 10 minutes in a belt furnace so as to form electrodes. Then, insulating resistance value in high temperature is measured under an applied voltage of 500 V for 60 seconds and at a measuring temperature of 120° C.

A resonance frequency 'f' and a value of unloaded Q value in microwave zone are determined about the produced cylinder by dielectric resonator method. Then, a specific inductive capacity is calculated from dimensions of the sintered body and resonance frequency of the sintered body. The resonance frequency is 3 to 5 GHz. A Qf product is calculated by multiplying the unloaded Q value and the resonance frequency 'f', which becomes an index representing a loss of the dielectric ceramic composition. This is a method commonly adopted by a person skilled in the art. Meanwhile, by measuring the resonance frequencies at −25° C., 20° C. and 85° C., temperature coefficient (TCF) is calculated by least-square method.

Listed in Table 3 are evaluation results of characteristics of dielectric ceramic composition having different compositional proportions in the $BiO_{3/2}$—CaO—$NbO_{5/2}$ material (hereinafter called BCN material) added by a supplemental ingredient which is a type of glass composed of $SiO_2$, $Li_2O$ and MO as major compounds. The characteristics of the dielectric ceramics and characteristics of the ceramic electronic component are explained in details later.

TABLE 3

| No. | main Ingredient | supplemental ingredient kind | supplemental ingredient added amount | firing temp. | characteristics of dielectric ceramics specific inductive capacity | Qf prod. | TCF | characteristics of multilayer resonator reso. freq. | Q value | TCF |
|---|---|---|---|---|---|---|---|---|---|---|
| 100 | Japanese Pat. No. 2798105, table 2, no. 2 | | | 925 | 61 | 2300 | +23 | 2.0 | 150 | +19 |
| 101 | 1 | none | | 1000 | 58 | 2800 | +21 | sintered impractically at 950° C. | | |
| 102 | 1 | A | 0.05 | 925 | 58 | 3200 | +21 | 2.1 | 230 | +16 |
| 103 | 1 | A | 0.5 | 900 | 57 | 3300 | +18 | 2.1 | 240 | +15 |
| 104 | 1 | A | 1.0 | 875 | 56 | 2500 | +18 | 2.1 | 240 | +15 |
| 105 | 1 | A | 2.0 | 875 | 54 | 2000 | +16 | 2.2 | 210 | +15 |
| 106 | 1 | A | 2.5 | 875 | 51 | 1200 | +15 | 2.3 | 120 | +14 |
| 107 | 2 | A | 0.5 | 900 | 57 | 3500 | +16 | 2.1 | 250 | +12 |
| 108 | 3 | A | 0.5 | 900 | 60 | 2500 | +25 | 2.0 | 220 | +20 |
| 109 | 4 | A | 0.5 | 900 | 63 | 2300 | +25 | 1.9 | 210 | +20 |
| 110 | 5 | A | 0.5 | 925 | 58 | 2200 | +20 | 2.1 | 210 | +18 |
| 111 | 6 | A | 0.5 | 925 | 62 | 2000 | +26 | 2.0 | 200 | +24 |
| 112 | 7 | A | 0.5 | 925 | 68 | 2200 | −14 | 1.9 | 200 | −18 |
| 113 | 8 | A | 0.5 | 875 | 60 | 2400 | +26 | 2.0 | 150 | +26 |
| 114 | 9 | A | 2.0 | 975 | 68 | 2200 | −8 | sintered impractically at 950° C. | | |
| 115 | 10 | A | 0.5 | 900 | 58 | 1200 | +26 | 2.1 | 150 | +25 |
| 116 | 11 | A | 2.0 | 975 | 73 | 1800 | −20 | sintered impractically at 95° C. | | |
| unit | | | wt % | ° C. | — | GHz | ppm/K | GHz | — | ppm/K |

FIG. 1 comparatively shows regions covered by the BCN material and the conventional technology patented by Japanese Patent Publication No. 2798105. A cross-hatched region 11 (including the boundary lines) is what is claimed by the present invention and a diagonally lined region 12 including region 11 enclosed by a pentagon is what is covered by patent No. 2798105. As is evident in FIG. 1, the region of composition covered by the present invention is restricted to the area where proportion of $BiO_{3/2}$ is small.

With sample numbers 101 to 106, the compositional proportion of the BCN material and the glass material is fixed, but the adding amount of the glass material is changed. On the other hand, with sample numbers 107 to 116, the compositional proportions in the BCN are changed and the composite A in Table 2 is added as a supplemental ingredient, evaluation results of which are as shown.

Following, the ceramic electronic component in accordance with the present embodiment is explained with references to FIGS. 2 to 5C. Dielectric layer 1 made of the dielectric ceramic composition is produced with a green sheet. Strip line conductive layer (first layer) 2 is made of a high conductive metallic material such as gold, silver or copper. Conductive layer (second layer) 3 forms a capacitor with first layer 2 and is connected to signal terminal electrode 6. Shield conductive layer (third layer) 4 is made of an identical material with that of first layer 2 and is connected to ground terminal electrode 5. Material of electrodes 5 and 6 can be identical with that of first conductive layer 2, or can be a different electrode material.

Next, fabrication method and evaluation method of a multilayer resonator having silver as a conductive layer is explained as an example of ceramic electronic component employing the dielectric ceramic composition according to the present embodiment. Initially, organic binder, solvent and plasticizer are added to and mixed with dielectric ceramic composition powder in a ball mill or the like so as to obtain slurry. The slurry is formed into a green sheet in a thickness of 80 μm by the doctor blade method. Silver of 100% purity is used as a conductive material. Granulated silver in a prescribed powder size is kneaded with an organic vehicle which is mixture of ethyl cellulose and solvent so as to obtain silver paste.

With the green sheets and the silver paste, first layer 2, second layer 3 and third layer 4 are formed on green sheets 1A by screen printing method as shown in FIGS. 5A to 5C. After the electrode patterns are printed, the green sheets are laminated. The lamination body is thermal pressed tight under a condition of 40° C. and 500 kg/cm². After the product has been cut into individual pieces, the chips are heat treated at 500° C. for 10 hours such that the organic compounds are burnt out. Then, the chips are sintered at 850 to 950° C. for 2 hours. Then afterward, commercially available silver paste is applied to the chips forming electrodes 5 and 6 as shown in FIGS. 2 to 4, so as to be burnt at 800° C. for 10 minutes. As a result, a multilayer resonator is obtained. After firing, size of the strip line on first layer 2 is about 4.0 mm in length, about 1.0 mm in width and about 2.0 mm in thickness.

A chip type multilayer capacitor is connected to second layer 3 of the multiplayer resonator thus produced in series through electrode 5. Impedance is matched to about 50Ω, then resonance frequency, Q value and temperature coefficient (TCF) of the multilayer resonator are measured by a network analyzer.

On the other hand, a material having the composition shown below is prepared as sample No. 100, which is a conventional example. The composition of sample 100 can be co-fired with silver conductive material, and is disclosed in Japanese Patent No. 278015. Evaluation results of the samples according to the present embodiment and those of the conventional example are as shown in Table 3.

BCN material: x=0.49, y=0.20, z=0.31, in number of atoms Copper oxide is added in an amount of [Cu/(Bi+Ca+Nb)]=0.01

As shown in Table 3, with sample 100 of the conventional example, Qf product is 2,300 GHz, which is excellent in the material characteristics of the dielectric ceramics, but the Q value of the multilayer resonator having first layer 2 of silver conductive material is low like 150. In contrast, with the dielectric ceramics of which compositions are within the prescribed region, the Q values of the multiplayer resonators are all 200 or more although there is no significant difference in the characteristics in the material.

An adding amount of glass material is preferably in a region of 0.05 to 2 wt %. When the adding amount is insufficient, sintering the resonator at lower than 950° C. becomes impracticable, making co-firing of resonator with silver conductive material infeasible. If the added amount is more than enough, Q value rapidly falls down.

With BCN material having compositional proportion in samples 114 and 116, firing temperature exceeds 950° C., making co-firing with silver conductive material not feasible therefore the compositions are not preferable. With such compositional proportion of BCN material in sample 115, the Qf product, a proper characteristic of the dielectric ceramic material, is low, causing the Q value of the multilayer resonator low, therefore the composition is not preferable either. With the compositional proportion of sample 113, the Q value of the multilayer resonator is also low although the characteristics of the dielectric ceramics are good, which is similar to the case of sample 100 therefore the material is not preferable either.

The BCN materials of comparative samples 100 and 113 have a larger proportion of $BiO_{3/2}$ than what is specified in FIG. 1. With such materials, it is understood that an excessive $BiO_{3/2}$ reacts with silver as the conductive material of a multilayer resonator while they are fired, greatly deteriorating the Q value of the resonator.

As described above, the dielectric layer made of the dielectric ceramics in a specified region in FIG. 1 and a conductive layer having silver as an electrode are laminated and then fired, thus a multilayer resonator of compact, easy-mount and having excellency in high frequency zone is obtained. Namely, a ceramic electronic component having an excellent performance in microwave zone is obtained.

Figure 6:
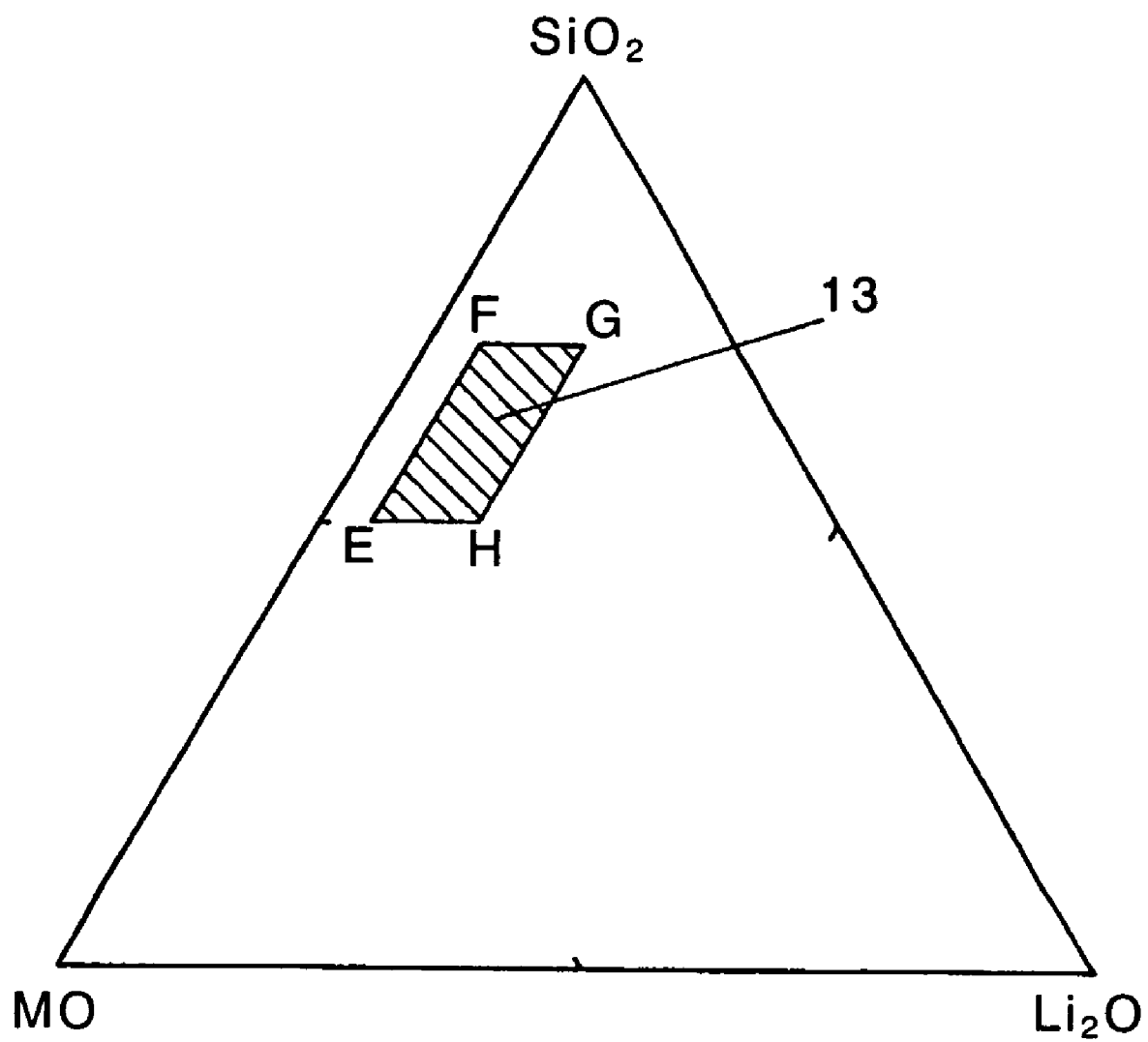
FIG. 6 is a diagram showing a region of composition of a glass composition, a supplemental ingredient in accordance with the exemplary embodiment of the present invention.

The composition of the glass composition, the supplemental ingredient, is explained hereinafter. Table 4 shows composition of materials in which the compositional proportion of BCN material is fixed and glass composition having different proportions in $SiO_2$, $Li_2O$, and MO listed in Table 2 is added to have 0.5 wt %. The table also exhibits the material characteristics of dielectric ceramics and the electrical characteristics of multilayer resonators as examples of the ceramic electronic components, evaluated by the procedures mentioned above. FIG. 6 is a diagram showing a region of composition of the glass composition, the supplemental ingredient, according to the present embodiment, by hatched region 13 (including the boundary lines). The kinds of A to D in Table 2 are within region 13, and the kinds of E to H are at vertices of region 13.

TABLE 4

| No. | Main ingredient | supplemental ingredient kind | added amount | firing temp. | dielectric ceramics characteristics specific inductive capacity | Qf product | TCF | multilayer resonator characteristics resonance freq. | Q value | TCF |
|---|---|---|---|---|---|---|---|---|---|---|
| 117 | 1 | B | 0.5 | 900 | 58 | 3000 | +19 | 2.1 | 235 | +13 |
| 118 | 1 | C | 0.5 | 900 | 59 | 3200 | +20 | 2.1 | 240 | +15 |
| 119 | 1 | D | 0.5 | 900 | 59 | 3100 | +21 | 2.1 | 240 | +18 |
| 120 | 1 | E | 0.5 | 925 | 58 | 3200 | +15 | 2.1 | 230 | +17 |
| 121 | 1 | F | 0.5 | 900 | 56 | 3000 | +5 | 2.1 | 230 | +16 |
| 122 | 1 | G | 0.5 | 900 | 58 | 2800 | +20 | 2.1 | 220 | +15 |
| 123 | 1 | H | 0.5 | 900 | 59 | 2600 | +19 | 2.1 | 220 | +18 |
| 124 | 1 | I | 0.5 | 925 | 58 | 3000 | +20 | 2.1 | 220 | +19 |
| 125 | 1 | J | 0.5 | 900 | 57 | 3000 | +18 | 2.1 | 220 | +15 |
| 126 | 1 | K | 0.5 | 900 | 60 | 2200 | +25 | 2.0 | 190 | +16 |
| 127 | 1 | L | 0.5 | 950 | 58 | 3300 | +23 | 2.0 | 240 | +14 |
| 128 | 1 | M | 0.5 | 950 | 58 | 2800 | +25 | 2.0 | 220 | +16 |
| 129 | 1 | N | 0.5 | 875 | 55 | 2000 | +24 | 2.2 | 190 | +16 |
| unit | | | wt % | ° C. | — | GHz | ppm/K | GHz | — | ppm/K |

As exhibited in Table 4, there is no significant variations in material characteristics of the dielectric ceramics or in electrical characteristics of the multilayer resonator as long as the materials are within the scope of the composition specified by region 13 (including boundary line) in FIG. 6. It is also noticed that high Q values of 220 or more are obtained in any of the multilayer resonators in the table.

On the other hand, in cases of sample 126 having a smaller $SiO_2$ proportion and sample 129 having a larger $Li_2O$ proportion than what are specified in region 13 in FIG. 6, material characteristics is deteriorated to some extent, correspondingly Q value of the multilayer resonator is dropped. With material composition of samples 127 and 128, sintering temperature goes up high like 950° C., so that when the material is co-fired with silver conductive material, there is a possibility that a part of the silver conductive material is melted down due to difference of temperature in a firing furnace, causing a problem for practical usage.

Consequently, it is desirable that the compositional proportion of the glass composition as the supplemental ingredient be controlled within region 13 (including boundary line) as specified in FIG. 6.

It is possible to add such as $Al_2O_3$, $B_2O_3$, $Na_2O$, $SnO_2$ and $P_2O_5$ to the glass composition, as long as they do not adversely affect the characteristics. Moreover, although Table 4 shows only the experimental results made by fixing the composition of the main ingredients and the added amount of the supplemental ingredients, an identical effect is obtained as long as the main ingredients are within the scope of compositional proportion in FIG. 1. Further, as long as an added amount of the glass composition is in a range of 0.05 to 2 wt % as previously mentioned, the identical effect is still obtained.

Furthermore, an effect of adding copper oxide (CuO) to the dielectric ceramic compositions as a second supplemental ingredient is explained. First, dielectric ceramic compositions are prepared by adding 0.05 to 0.15 wt % of CuO to 100 wt % of sample 103. Characteristics of the dielectric ceramic compositions and the multilayer resonators employing such compositions are exhibited in Table 5.

TABLE 5

| No. | main ingredient | supplemental ingredient kind | supplemental added amt. | secondary supplemental ingredient CuO | dielectric ceramics characteristics specific firing temp. | inductive capacity | Qf prod. | TCF | multilayer resonator characteristics reso. freq. | Q val. | TCF |
|---|---|---|---|---|---|---|---|---|---|---|---|
| 103 | 1 | A | 0.5 | 0 | 900 | 58 | 3000 | +19 | 2.1 | 235 | +13 |
| 130 | 1 | A | 0.5 | 0.05 | 875 | 58 | 3200 | +20 | 2.1 | 230 | +15 |
| 131 | 1 | A | 0.5 | 0.1 | 875 | 58 | 3000 | +21 | 2.1 | 200 | +18 |
| 132 | 1 | A | 0.5 | 0.15 | 850 | 58 | 2800 | +19 | 2.1 | 180 | +17 |
| unit | | | wt % | wt % | ° C. | — | GHz | ppm/K | GHz | — | ppm/K |

As shown in Table 5, the firing temperature can be lowered by 25° C. or more by adding a small amount of CuO. Because temperature difference between the firing temperature and a melting-temperature of silver 962° C. is much widened due to adding CuO, a stable firing can be realized at mass production. However, if CuO is added too much as in the case of sample 132, the Q value of the multilayer resonator drops by too large a value even though Qf product of the dielectric ceramic composition does not fall down as much. As such, an excessively added CuO can be a reason for causing a reaction with the silver conductor, therefore the adding amount shall be preferably 0.05 wt % at least and 0.1 wt % at most.

Impurities are allowed as long as they do not cause unfavorable effects in the characteristics. Other copper compound can be added in place of CuO. In this case, 0.1 wt % or less in a converted weight percentage to CuO is preferable. In Table 5, evaluation values measured by fixing the composition of main ingredients and glass composition are shown, similar effects are obtained as long as the compositions are in the scope of regions specified in FIGS. 1 and 6.

Still more, although silver is used as conductive layer in the present embodiment, a conductive layer containing silver in an amount of 95 wt % or more exhibits above mentioned effects.

As demonstrated above, with the dielectric ceramic composition in accordance with the present invention, reaction with silver is prevented; and even when the dielectric ceramic composition is co-fired with a conductive layer having silver as a main ingredient, a high Q value of the dielectric ceramic composition is obtained. This dielectric ceramic composition is useful for compact and high-performance ceramic electronic components including a filter, an antenna, a capacitor, an inductor and a circuit board.

The invention claimed is:

1. A dielectric ceramic composition comprising:
   a main ingredient consisting essentially of bismuth oxide, calcium oxide and niobium oxide and expressed by a formula $xBiO_{3/2}$-$yCaO$-$zNbO_{5/2}$ (x, y, z are in molar ratio, and x+y+z=1.0), wherein x, y, and z are in a scope of region enclosed by a quadrilateral having following vertices A, B, C and D in a ternary system diagram of the main ingredient,
   A: (x, y, z)=(0.48, 0.184, 0.336)
   B: (x, y, z)=(0.48, 0.22, 0.30)
   C: (x, y, z)=(0.44, 0.24, 0.32)
   D: (x, y z)=(0.44, 0.20, 0.36), and
   a glass composition including at least 0.05 wt % and at most 2 wt % of $uSiO_2$-$vLi_2O$-$wMO$ (u, v, w are in weight percentage, u+v+w=100, and M is at least one of Ca, Sr and Ba).

2. The dielectric ceramic composition according to claim 1,
   wherein u, v, and w are in a scope of region enclosed by a quadrilateral having following vertices E, F, G and H in a ternary system diagram of the glass composition,
   E: (u, v, w)=(50, 5, 45)
   F: (u, v, w)=(70, 5, 25)
   G: (u, v, w)=(70, 15, 15)
   H: (u, v, w)=(50, 15, 35).

3. The dielectric ceramic composition according to claim 1,
   wherein at least 0.05 wt % and at most 0.1 wt % of copper oxide in terms of CuO is added in 100 wt % of the main ingredient.

4. A ceramic electronic component comprising:
   a dielectric layer made of a dielectric ceramic composition, the dielectric ceramic composition comprising:
   a main ingredient consisting essentially of bismuth oxide, calcium oxide and niobium oxide and expressed by a formula $xBiO_{3/2}$-$yCaO$-$zNbO_{5/2}$ (x, y, z are in molar ratio, and x+y+z=1.0), and
   a glass composition including at least 0.05 wt % and at most 2 wt % of $uSiO_2$-$vLi_2O$-$wMO$ (u, v, w are in weight percentage, u+v+w=100, and M is at least one of Ca, Sr and Ba),
   wherein, x, y, and z are in a scope of region enclosed by a quadrilateral having following vertices A, B, C and D in a ternary system diagram of the main ingredient,
   A: (x, y, z)=(0.48, 0.184, 0.336)
   B: (x, y, z)=(0.48, 0.22, 0.30)
   C: (x, y, z)=(0.44, 0.24, 0.32)
   D: (x, y z)=(0.44, 0.20, 0.36), and
   a conductive layer including at least 95 wt% of silver, the conductive layer being laminated with the dielectric layer.

5. A method for manufacturing a ceramic electronic component, comprising:
   preparing green sheets comprising:
   a dielectric ceramic composition containing a main ingredient consisting essentially of bismuth oxide, calcium oxide, and niobium oxide and expressed by a formula $xBiO_{3/2}\text{-}yCaO\text{-}zNbO_{5/2}$ (x, y, z are in molar ratio, and x+y+z=1.0), x, y, and z are in a scope of region enclosed by a quadrilateral having following vertices A, B, C and D in a ternary system diagram of the main ingredient, wherein
   A: (x, y, z)=(0.48, 0.184, 0.336)
   B: (x, y, z)=(0.48, 0.22, 0.30)
   C: (x, y, z)=(0.44, 0.24, 0.32)
   D: (x, y z)=(0.44, 0.20, 0.36), and
   a glass composition including at least 0.05 wt % and at most 2 wt % of $uSiO_2\text{-}vLi_2O\text{-}wMO$ (u, v, w are in weight percentage, u+v+w=100, and M is at least one of Ca, Sr and Ba),
   printing predetermined patterns on the green sheets by using a paste comprising at least 95 wt % of silver as a conductive content,
   preparing a lamination body in a manner that the printed green sheets are laminated, and
   firing the lamination body to provide dielectric layers and conductive layers simultaneously.

* * * * *